(12) United States Patent
Zhu et al.

(10) Patent No.: US 11,742,423 B2
(45) Date of Patent: Aug. 29, 2023

(54) LATERALLY DOUBLE-DIFFUSED METAL OXIDE SEMICONDUCTOR DEVICE

(71) Applicants: SOUTHEAST UNIVERSITY, Jiangsu (CN); CSMC TECHNOLOGIES FAB2 CO., LTD., Jiangsu (CN)

(72) Inventors: Jing Zhu, Jiangsu (CN); Guichuang Zhu, Jiangsu (CN); Nailong He, Jiangsu (CN); Sen Zhang, Jiangsu (CN); Shaohong Li, Jiangsu (CN); Weifeng Sun, Jiangsu (CN); Longxing Shi, Jiangsu (CN)

(73) Assignees: SOUTHEAST UNIVERSITY, Jiangsu (CN); CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 17/761,510

(22) PCT Filed: Aug. 20, 2020

(86) PCT No.: PCT/CN2020/110169
§ 371 (c)(1),
(2) Date: Mar. 17, 2022

(87) PCT Pub. No.: WO2021/077881
PCT Pub. Date: Apr. 29, 2021

(65) Prior Publication Data
US 2022/0352369 A1   Nov. 3, 2022

(30) Foreign Application Priority Data
Oct. 21, 2019 (CN) .......................... 201911001601.3

(51) Int. Cl.
*H01L 29/78* (2006.01)
*H01L 29/08* (2006.01)
*H01L 29/10* (2006.01)

(52) U.S. Cl.
CPC ........ *H01L 29/7824* (2013.01); *H01L 29/086* (2013.01); *H01L 29/0878* (2013.01); *H01L 29/1095* (2013.01)

(58) Field of Classification Search
CPC ..... H01L 29/08; H01L 29/086; H01L 29/087; H01L 29/0878; H01L 29/10;
(Continued)

(56) References Cited

U.S. PATENT DOCUMENTS

2004/0169208 A1    9/2004  Husher
2020/0251575 A1*   8/2020  Kim ................ H01L 21/76224

FOREIGN PATENT DOCUMENTS

| CN | 101587910 A | 11/2009 |
| CN | 101771081 A | 7/2010 |
| CN | 102593119   | * 12/2011 ......... H01L 29/1095 |

* cited by examiner

*Primary Examiner* — Fazli Erdem
(74) *Attorney, Agent, or Firm* — Global IP Services; Tianhua Gu

(57) ABSTRACT

A laterally double-diffused metal oxide semiconductor device is provided, including: a drift region (3) having a first conductivity type; a first body region (10) disposed on the drift region (3) and having a second conductivity type, the first conductivity type and the second conductivity type being opposite conductivity types; a first conductivity type region (13) disposed in the first body region (10); a second body region (12) disposed in the first conductivity type region (13) and having the second conductivity type; a source region (11) disposed in the second body region (12) and having the first conductivity type; and a contact region (9) disposed in the first body region (10) and having the second conductivity type.

11 Claims, 3 Drawing Sheets

(58) Field of Classification Search
CPC ............... H01L 29/1095; H01L 29/42; H01L 29/42368; H01L 29/78; H01L 29/7816; H01L 29/7817; H01L 29/7818; H01L 29/7824
USPC ........................................................ 257/343
See application file for complete search history.

LATERALLY DOUBLE-DIFFUSED METAL OXIDE SEMICONDUCTOR DEVICE

CROSS REFERENCE TO RELATED PATENT APPLICATION

The present application is the US national stage of PCT/CN2020/110169 filed on 2020 Aug. 20, which claims the priority of the Chinese patent application No. 201911001601.3 filed on 2019 Oct. 21, which application is incorporated herein by reference.

TECHNICAL FIELD

The present disclosure relates to the field of semiconductor manufacturing, and in particular, to a laterally double-diffused metal oxide semiconductor device.

BACKGROUND

There is a body diode inside a laterally diffused metal oxide semiconductor (LDMOS) device. The body diode plays a leading role during freewheeling of the device. However, during reverse recovery of the body diode, when electron holes in a drift region are extracted back to a source through a P-body and a source region P+, due to existence of resistance in a P-body region, a specific voltage drop is generated between the P-body and the source region N+. When the voltage drop is greater than a forward on-voltage drop of a PN junction formed by the P-body and the source region N+, parasitic NPN formed by the source region N+, the P-body, and N-drift is turned on, resulting in a sharp increase in a current and a reverse recovery failure. As shown in FIG. 4, a dashed line indicates that reverse recovery is normal, and a solid line indicates that the reverse recovery fails.

If reverse recovery of a device fails, other devices may be damaged during application of a circuit, which seriously affects the security and reliability of the device and the circuit.

SUMMARY

The present disclosure provides a laterally double-diffused metal oxide semiconductor device, including: a drift region having a first conductivity type; a first body region disposed on the drift region and having a second conductivity type, the first conductivity type and the second conductivity type being opposite conductivity types; a first conductivity type region disposed in the first body region; a second body region disposed in the first conductivity type region and having the second conductivity type; a source region disposed in the second body region and having the first conductivity type; and a contact region disposed in the first body region and having the second conductivity type.

Details of one or more embodiments of the present disclosure are provided in the following accompanying drawings and descriptions. Other features, objectives, and advantages of the present disclosure will be apparent from the specification, the accompanying drawings, and the claims.

BRIEF DESCRIPTION OF THE DRAWINGS

To better describe and illustrate embodiments and/or examples in the present disclosure disclosed herein, references may be made to one or more accompanying drawings. Additional details or examples used to describe the accompanying drawings are not to be considered as limiting the scope of any of the disclosed disclosure, currently described embodiments and/or examples, and best modes of the present disclosure currently understood.

DETAILED DESCRIPTION OF THE PREFERRED EMBODIMENTS

Figure 1:
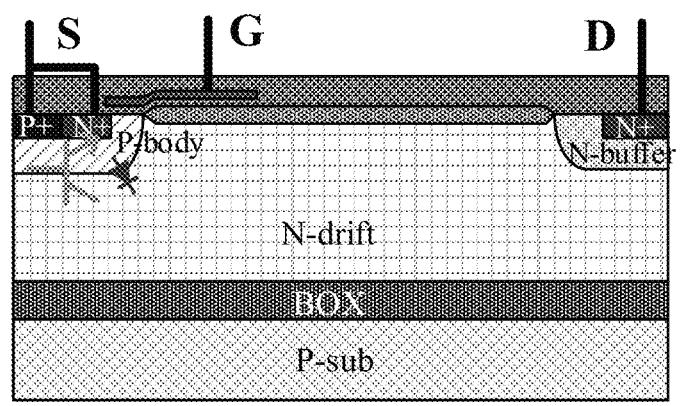
FIG. 1 is a schematic diagram of a cross-sectional structure of an exemplary laterally double-diffused metal oxide semiconductor device.

For ease of understanding the present disclosure, the present disclosure is described more comprehensively below with reference to the accompanying drawings. Preferred embodiments of the present disclosure are provided in the accompanying drawings. However, the present disclosure may be implemented in many different forms, and is not limited to the embodiments described in this specification. On the contrary, an objective of providing the embodiments is to make the disclosed content of the present disclosure more comprehensive.

Unless otherwise defined, meanings of all technical and scientific terms used in this specification are the same as that usually understood by a person skilled in the art to which the present disclosure belongs. In this specification, terms used in the specification of the present disclosure are merely intended to describe objectives of the specific embodiments, but are not intended to limit the present disclosure. The term "and/or" used in this specification includes any or all combinations of one or more related listed items.

It should be understood that when an element or layer is referred to as being "on", "adjacent to", "connected to" or "coupled to" other elements or layers, the element or layer may be directly located on, adjacent, connected or coupled to the other elements or layers, or there may be an intervening element or layer. Conversely, when an element is referred to as being "directly on", "directly adjacent to", "directly connected to" or "directly coupled to" other elements or layers, there is no intervening element or layer. It should be understood that although the terms first, second, third, and the like can be used to describe various elements, components, regions, layers, and/or portions, these elements, components, regions, layers and/or portions should not be limited by these terms. These terms are only used to distinguish one element, component, region, layer or portion from another element, component, region, layer or portion. Therefore, without departing from the teachings of the present disclosure, the first element, component, region, layer or portion discussed below may be expressed as a second element, component, region, layer or portion.

The terms indicating the spatial relationships such as "under", "below", "lower", "beneath", "above", and "upper" are used herein for the convenience of description, to describe the relationship between one element or feature and other elements or features shown in the figure. It should be understood that in addition to the orientations shown in the figures, the terms indicating the spatial relationships are also intended to include different orientations of a device in use and operation. For example, if the device in the figure is upside down, then an element or feature described as being "under", "beneath" or "below" other elements will be oriented to be "above" the other elements or features. Therefore, the exemplary terms "under" and "below" may include both an upper and a lower orientation. The device can be otherwise oriented (rotated by 90 degrees or in other orientations) and the spatial descriptions used here are interpreted accordingly.

The terms are used herein merely for purpose of describing specific embodiments and not as a limitation of the present disclosure. When used herein, the singular forms "a", "an" and "the" are also meant to include the plural form, unless otherwise clearly indicated. It should also be understood that the terms "consisting of" and/or "including", when used in this specification, confirm the existence of the described features, integers, steps, operations, elements and/or components, but do not exclude the existence or addition of one or more other features, integers, steps, operations, elements, components and/or groups. As used herein, the term "and/or" includes any and all combinations of related listed items.

Embodiments of the present disclosure are described herein with reference to cross-sectional views of schematic diagrams as ideal embodiments (and intermediate structures) of the present disclosure. In this way, changes from the shown shape caused by, for example, a manufacturing technology and/or a tolerance may be predicted. Therefore, the embodiments of the present disclosure should not be limited to a specific shape of a region shown herein, but include shape deviations caused by, for example, manufacturing. For example, an edge of an implantation region shown as a rectangle generally has a rounded or curved feature and/or an implantation density gradient, instead of a binary change from the implantation region to a non-implantation region. Similarly, a buried region formed through implantation may result in some implantation in a region between the buried region and a surface through which the implantation passes. Therefore, regions shown in the figure are substantially exemplary, and shapes of the regions are not intended to show actual shapes of the regions of the device and are not intended to limit the scope of the present disclosure.

The terms in the field of semiconductors used in this specification are technical terms commonly used by a person skilled in the art. For example, for P-type and N-type impurities, to distinguish between doping densities, simply, P+ represents a P-type of a heavy doping density, P represents a P-type of a medium doping density, P− represents a P-type of a light doping density, N+ represents an N-type of a heavy doping density, N represents an N-type of a medium doping density, and N− represents an N-type of a light doping density.

For a device with a relatively large working current, a relatively high on-resistance is required, and resistance of the device needs to be reduced while ensuring a breakdown voltage. A general manner of reducing the on-resistance is to adjust a doping density of a drift region. However, because an increase in the doping density causes the breakdown voltage to drop, an additional structure, such as a field plate and a shallow trench isolation (STI) technology, is further required to ensure the breakdown voltage; in addition, a current flow path in the drift region may be further adjusted. That is, the current path in the drift region is made shorter, a length of the drift region is reduced, and so on. Currently, many related new structures are further derived from these aspects, such as a reduced surface field (RESURF) technology and a piecewise linear doping technology. However, all these structures reduce the breakdown voltage while reducing the on-resistance, and additional measures are required to ensure that both the breakdown voltage and on-resistance meet design indexes. In this case, the overall structure of the device is greatly changed.

Figure 2:
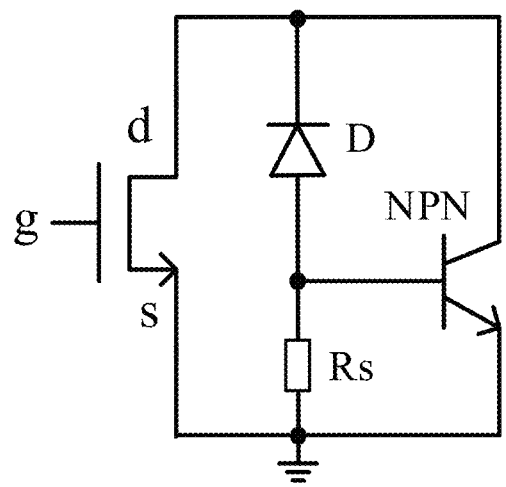
FIG. 2 is an equivalent circuit diagram of the device shown in FIG. 1.
Figure 4:
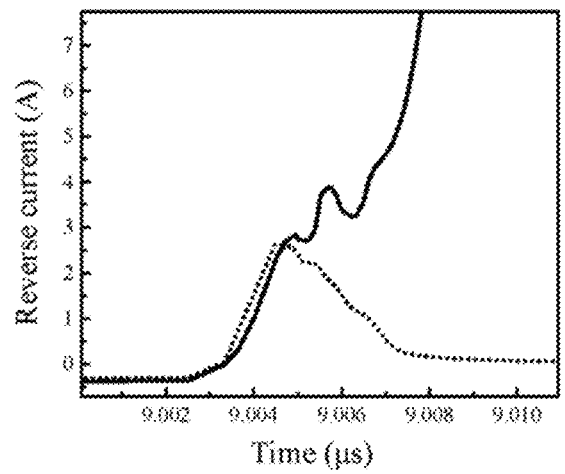
FIG. 4 shows exemplary current curves when reverse recovery of a body diode of a laterally diffused metal oxide semiconductor (LDMOS) is normal and fails.

FIG. 1 is a schematic diagram of a cross-sectional structure of an exemplary laterally double-diffused metal oxide semiconductor device. FIG. 2 is an equivalent circuit diagram of FIG. 1. The exemplary laterally double-diffused metal oxide semiconductor device includes a P-type substrate (P-sub), a buried oxide layer (BOX), a drift region (N-drift), a body region (P-body), a buffer region (N-buffer), a drain region N+, a source region N+, and a source region P+. Referring to FIG. 2, a gate, source, and drain of a laterally diffused metal oxide semiconductor (LDMOS) are represented by g, s, and d, respectively. A body diode D formed by the body region and the drift region plays a leading role during freewheeling of the device. However, during reverse recovery of the body diode D, when electron holes in the drift region are extracted back to the source through the body region and the source region P+, due to existence of resistance Rs in the body region, a specific voltage drop is generated between the body region and the source region N+; when the voltage drop is greater than a forward on-voltage drop of a PN junction formed by the body region and the source region N+, parasitic NPN formed by the source region N+, the body region, and the drift region is turned on, resulting in a sharp increase in a current and a reverse recovery failure, as shown in FIG. 4. An exemplary solution is to use a trench isolation technology. However, in this way, the size of the device becomes larger, and a process has high costs and complexity. Sometimes, it is difficult to implement the trench isolation technology due to limited conditions.

Figure 3:
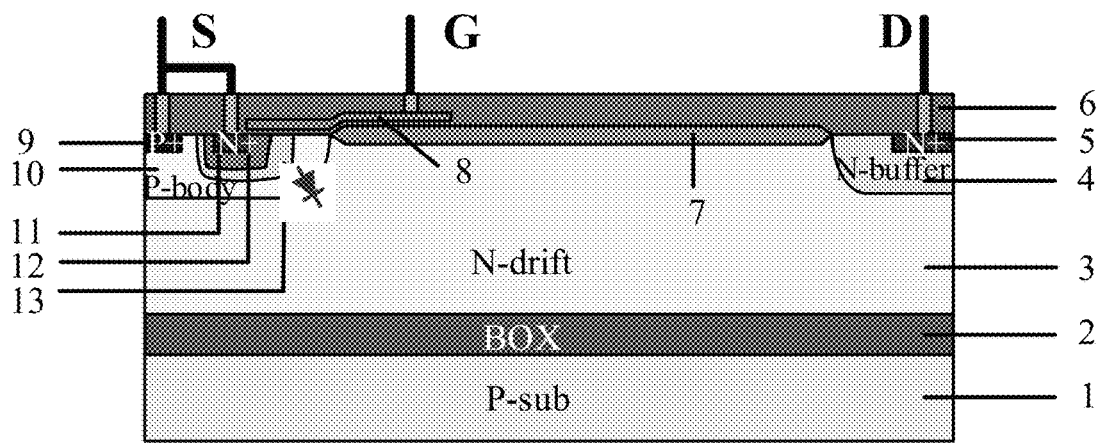
FIG. 3 is a schematic diagram of a cross-sectional structure of a laterally double-diffused metal oxide semiconductor device in an embodiment.

FIG. 3 is a schematic diagram of a cross-sectional structure of a laterally double-diffused metal oxide semiconductor device in an embodiment, which includes a drift region 3, a first body region 10, a first conductivity type region 13, a second body region 12, a source region 11, and a contact region 9. The drift region 3 has a first conductivity type. The first conductivity type region 13 is disposed in the first body region 10. The second body region 12 is disposed in the first conductivity type region 13 and has a second conductivity type. The source region 11 is disposed in the second body region 12 and has the first conductivity type. The contact region 9 is disposed in the first body region 10 and has the second conductivity type.

In the embodiment shown in FIG. 3, the first conductivity type is an N-type, and the second conductivity type is a P-type. Specifically, the drift region 3 is an N-type drift region N-drift, and both the first body region 10 and the second body region 12 are P-type body regions. The first conductivity type region 13 is an N-type isolation layer capable of isolation in this application. The source region 11 is a source heavily-doped N-type (N+) region, and the contact region 9 is a source heavily-doped P-type (P+)

region. In another embodiment, alternatively, the first conductivity type may be a P type, and the second conductivity type may be an N type.

The laterally double-diffused metal oxide semiconductor device isolates the source region 11 from the first body region 10 by using the second body region 12 and the first conductivity type region 13. In this way, during reverse recovery of a body diode of an LDMOS, even if a specific voltage drop is generated between the first body region 10 and the source region 11 when electron holes in the drift region 3 are extracted back to a source through the first body region 10 and the contact region 9, electrons cannot be implanted into the first body region 10 through the source region 11. The electron holes can be extracted back to the source through the contact region 9. Because parasitic NPN formed by the source region 11, the first body region 10, and the drift region 3 is not turned on, a problem of reverse recovery failure caused by the parasitic NPN being turned on during reverse recovery of the body diode of the LDMOS is resolved.

In the embodiment shown in FIG. 3, the laterally double-diffused metal oxide semiconductor device further includes a drain region 5 disposed on the drift region 3. Specifically, the drain region 5 is a drain heavily-doped N-type (N+) region.

In the embodiment shown in FIG. 3, the laterally double-diffused metal oxide semiconductor device further includes a buffer region 4 disposed on the drift region 3. The buffer region 4 is disposed in the drift region 3, and the buffer region 4 has the first conductivity type.

In the embodiment shown in FIG. 3, the laterally double-diffused metal oxide semiconductor device further includes a substrate 1 having the second conductivity type and a buried oxide layer 2 on the substrate, and the drift region 3 is disposed on the buried oxide layer. Specifically, the substrate 1 is P-sub.

In an embodiment, the laterally double-diffused metal oxide semiconductor device further includes a gate disposed between the source region 11 and the drain region 5. In the embodiment shown in FIG. 3, the laterally double-diffused metal oxide semiconductor device further includes a field oxide layer 7 disposed between the source region 11 and the drain region 5, and the gate includes a polysilicon gate 8 extending from the source region 11 to the field oxide layer 7. The polysilicon gate 8 extends from the source region 11 to the field oxide layer 7 through the second body region 12, the first conductivity type region 13, and the first body region 10 successively. In the embodiment shown in FIG. 3, the contact region 9 and the first conductivity type region 13 are isolated by the first body region 10.

In an embodiment, a doping density of the drift region 3 and the buffer region 4 is lower than a doping density of the source region 11 and the drain region 5.

In an embodiment, a doping density of the first body region 10 is lower than a doping density of the contact region 9.

Figure 5:
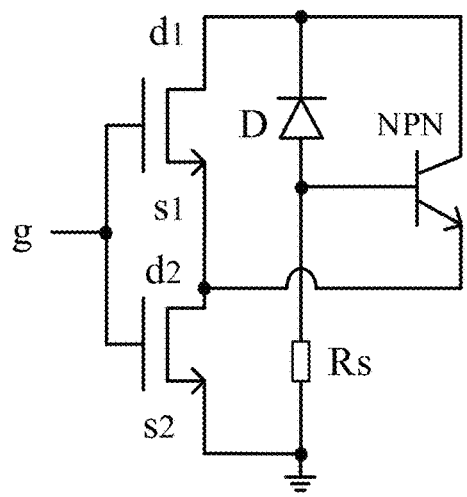
FIG. 5 is an equivalent circuit diagram of the device shown in FIG. 3.

Referring to FIG. 5, in this embodiment, the laterally double-diffused metal oxide semiconductor device is equivalent to having a first MOS transistor, a second MOS transistor, a body diode D, and a parasitic NPN triode. Referring to FIG. 3, the polysilicon gate 8 serves as a gate g of the first MOS transistor and the second MOS transistor, the first conductivity type region 13 serves as a source s1 of the first MOS transistor, a drain d2 of the second MOS transistor, and an emitter of the parasitic NPN triode, the drain region 5 serves as a drain d1 of the first MOS transistor, the source region 11 serves as a source S2 of the second MOS transistor, the drift region 3 serves as a cathode of the body diode D and a collector of the parasitic NPN triode, and the first body region 10 serves as an anode of the body diode D and a base of the parasitic NPN triode. The first body region 10 is further equivalent to resistance Rs in the body region. When the gate of the device is connected to a high potential, the drain is connected to a high potential, and the source is connected to a low potential, the first body region 10 and the second body region 12 under the polysilicon gate 8 may normally invert an electron channel, and the LDMOS can implement forward conduction. When the gate is connected to a low potential, the drain is connected to a high potential, and the source is connected to a low potential, the channel is turned off, and the body diode D formed by the first body region 10 and the drift region 3 inside the device is subject to voltage resistance. When the gate and the source are short connected to high potentials, and the drain is connected to a low potential, the body diode D formed by the first body region 10 and the drift region 3 inside the device is conducted, and the device may perform freewheeling. In summary, a working state and a working condition of the laterally double-diffused metal oxide semiconductor device are completely consistent with those of a conventional LDMOS.

Figure 6:
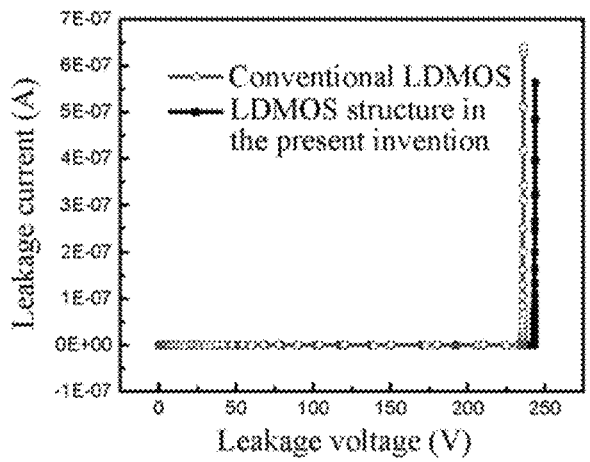
FIG. 6 shows voltage resistance characteristic curves of the present disclosure's and conventional laterally double-diffused metal oxide semiconductor devices.
Figure 7:
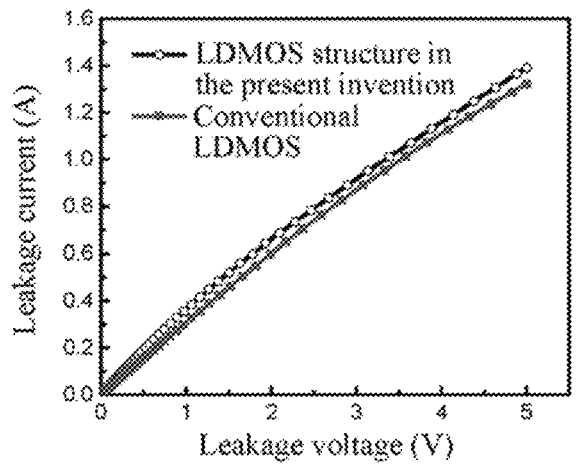
FIG. 7 shows conduction capability characteristic curves of the present disclosure's and conventional laterally double-diffused metal oxide semiconductor devices.
Figure 8:
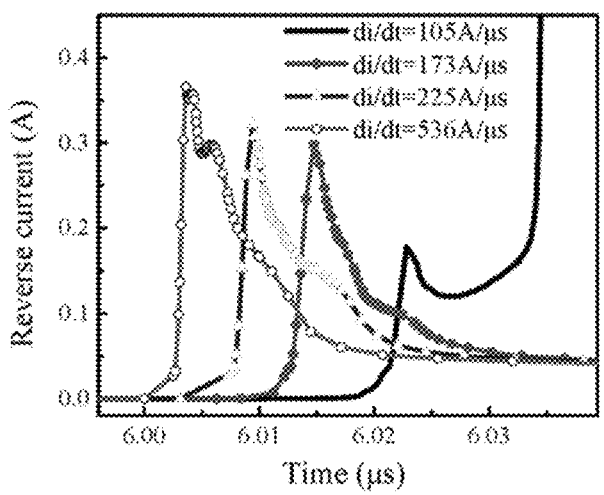
FIG. 8 shows a curve of a reverse recovery current (Irps) over time under a same freewheeling current value.

FIG. 6 shows voltage resistance characteristic curves of the present disclosure's and conventional laterally double-diffused metal oxide semiconductor devices, a horizontal coordinate and a vertical coordinate are respectively a voltage $V_{DS}$ and a flowing current $I_{DS}$ between the drain and source when a channel is turned off. FIG. 7 shows conduction capability characteristic curves of the present disclosure's and conventional laterally double-diffused metal oxide semiconductor devices, a horizontal coordinate and a vertical coordinate are respectively a voltage $V_{DS}$ and a flowing current $I_{DS}$ between the drain and source when a channel is turned on. It can be learned that the conduction capability characteristics and the voltage resistance characteristics of the laterally double-diffused metal oxide semiconductor device provided by the present disclosure are hardly sacrificed while resolving the problem of the reverse recovery failure of the body diode. Compared with a solution in which a trench isolation structure needs to be provided to resolve the problem of the reverse recovery failure of the body diode, in the present disclosure, there is no need to provide the trench isolation structure, the process is simple, the process compatibility is strong, and the size of the device is reduced. For example, FIG. 8 shows a curve of a reverse recovery current ($I_{DS}$) over time under a same freewheeling current value. A curve of di/dt=105 A/μs is a conventional laterally double-diffused metal oxide semiconductor device, and it can be learned that a conventional structure has reverse recovery failure at di/dt=105 A/μs. Other three curves belong to the laterally double-diffused metal oxide semiconductor device of the present disclosure, and it can be learned that there is still no reverse recovery failure at di/dt=536 A/μs, and the reverse recovery robustness of the body diode of the LDMOS is greatly improved.

The foregoing embodiments only describe several implementations of the present disclosure, and their description is specific and detailed, but cannot therefore be understood as a limitation to the patent scope of the present disclosure. It should be noted that, a person of ordinary skill in the art may further make several variations and improvements without departing from the concept of the present disclosure, which shall fall within the protection scope of the present disclosure. Therefore, the protection scope of the present disclosure shall be subject to the appended claims.

What is claimed is:

1. A laterally double-diffused metal oxide semiconductor device, comprising:
   a drift region having a first conductivity type;
   a first body region disposed on the drift region and having a second conductivity type, wherein the first conductivity type and the second conductivity type are opposite conductivity types;
   a first conductivity type region disposed in the first body region;
   a second body region disposed in the first conductivity type region and having the second conductivity type;
   a source region disposed in the second body region and having the first conductivity type;
   a contact region disposed in the first body region and having the second conductivity type;
   a drain region disposed on the drift region;
   a gate disposed between the source region and the drain region;
   wherein the first conductivity type is an N-type, and the second conductivity type is a P-type; and
   wherein the device is equivalent to having a first MOS transistor, a second MOS transistor, a body diode, and a parasitic NPN triode; gates of the first MOS transistor and the second MOS transistor comprise a polysilicon gate, a source of the first MOS transistor and a drain of the second MOS transistor comprise the first conductivity type region, a drain of the first MOS transistor comprises the drain region, a source of the second MOS transistor comprises the source region; the body diode has a cathode comprising the drift region, and an anode comprising the first body region; and the parasitic NPN triode has a base comprising the first body region, a collector comprising the drift region, and an emitter comprising the first conductivity type region.

2. The laterally double-diffused metal oxide semiconductor device according to claim 1, further comprising a buffer region disposed on the drift region, wherein the buffer region has the first conductivity type, and the buffer region is disposed in the drift region.

3. The laterally double-diffused metal oxide semiconductor device according to claim 1, further comprising a field oxide layer disposed between the source region and the drain region, wherein the gate comprises a polysilicon gate extending from the source region to the field oxide layer.

4. The laterally double-diffused metal oxide semiconductor device according to claim 2, wherein a doping density of the drift region and the buffer region is lower than a doping density of the source region and the drain region.

5. The laterally double-diffused metal oxide semiconductor device according to claim 1, further comprising a substrate having the second conductivity type and a buried oxide layer on the substrate, wherein the drift region is disposed on the buried oxide layer.

6. The laterally double-diffused metal oxide semiconductor device according to claim 1, wherein a doping density of the first body region is lower than a doping density of the contact region.

7. The laterally double-diffused metal oxide semiconductor device according to claim 1, wherein the first conductivity type region is an isolation layer for isolation.

8. The laterally double-diffused metal oxide semiconductor device according to claim 1, wherein the contact region and the first conductivity type region are separated by the first body region.

9. The laterally double-diffused metal oxide semiconductor device according to claim 1, wherein the drain region is a drain heavily-doped N-type (N+) region.

10. The laterally double-diffused metal oxide semiconductor device according to claim 3, wherein the polysilicon gate extends from the source region to the field oxide layer through the second body region, the first conductivity type region, and the first body region successively.

11. The laterally double-diffused metal oxide semiconductor device according to claim 1, wherein the source region is a source heavily-doped N-type (N+) region, and the contact region is a source heavily-doped P-type (P+) region.

* * * * *